(12) United States Patent
Koh et al.

(10) Patent No.: US 9,147,863 B2
(45) Date of Patent: Sep. 29, 2015

(54) SECONDARY BATTERY

(75) Inventors: Seok Koh, Suwon-si (KR); Youngcheol Jang, Suwon-si (KR); Kyungho Park, Suwon-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 1083 days.

(21) Appl. No.: 12/789,866

(22) Filed: May 28, 2010

(65) Prior Publication Data

US 2011/0052940 A1 Mar. 3, 2011

(30) Foreign Application Priority Data

Aug. 25, 2009 (KR) .................. 10-2009-0078907

(51) Int. Cl.
*H01M 2/34* (2006.01)
*H01M 2/02* (2006.01)
*H01M 2/06* (2006.01)
*H05K 1/14* (2006.01)
*H05K 1/11* (2006.01)

(52) U.S. Cl.
CPC .............. *H01M 2/0207* (2013.01); *H01M 2/06* (2013.01); *H01M 2/34* (2013.01); *H05K 1/141* (2013.01); *H05K 1/113* (2013.01)

(58) Field of Classification Search
CPC ....................................................... H01M 2/34
USPC ............................................................ 429/7
See application file for complete search history.

(56) References Cited

U.S. PATENT DOCUMENTS

| | | | |
|---|---|---|---|
| 6,218,041 B1 * | 4/2001 | Barbier et al. | 429/96 |
| 2004/0018396 A1 * | 1/2004 | Dorren et al. | 429/7 |
| 2007/0154793 A1 * | 7/2007 | Bang et al. | 429/160 |
| 2008/0176134 A1 | 7/2008 | Kim | |
| 2008/0205016 A1 | 8/2008 | Takatori et al. | |
| 2008/0233472 A1 | 9/2008 | Ota et al. | |
| 2008/0241674 A1 * | 10/2008 | Kim | 429/164 |
| 2008/0254359 A1 * | 10/2008 | Byun et al. | 429/163 |
| 2009/0123829 A1 | 5/2009 | Kim et al. | |
| 2010/0151281 A1 | 6/2010 | Kwag et al. | |

FOREIGN PATENT DOCUMENTS

| | | | |
|---|---|---|---|
| JP | 2006-344643 | * | 12/2006 |
| KR | 10-2007-0035877 A | | 4/2007 |
| KR | 10-2007-0072426 A | | 7/2007 |
| KR | 10-2007-0112477 A | | 11/2007 |
| KR | 10-0791551 B1 | | 12/2007 |
| KR | 10-2008-0068387 A | | 7/2008 |

(Continued)

OTHER PUBLICATIONS

Korean Office Action dated Jan. 17, 2011 for Korean Patent Application No. KR 10-2009-0078907 which corresponds to the captioned application.

(Continued)

*Primary Examiner* — Jacob Marks
(74) *Attorney, Agent, or Firm* — Knobbe, Martens, Olson & Bear, LLP (57) ABSTRACT

A secondary battery, including a bare cell, a protective circuit module (PCM) disposed on a top surface of the bare cell, the PCM comprising an external terminal a top surface thereof, and a printed circuit board (PCB) terminal disposed on the external terminal, the PCB terminal being electrically connected to the external terminal and an external device.

14 Claims, 5 Drawing Sheets

(56) References Cited

FOREIGN PATENT DOCUMENTS

| KR | 10-2009-0030706 A | 3/2009 |
| KR | 10-2010-0069159 A | 6/2010 |
| KR | 10-0998301 B1 | 11/2010 |
| WO | WO 2009/025433 A1 | 2/2009 |

OTHER PUBLICATIONS

Korean Notice of Allowance dated Oct. 28, 2011 for Korean Patent Application No. KR 10-2009-0078907 which corresponds to captioned U.S. Appl. No. 12/789,866.

* cited by examiner

SECONDARY BATTERY

CROSS-REFERENCE TO RELATED APPLICATION

This application claims the benefit of Korean Application No. 10-2009-0078907, filed Aug. 25, 2009, in the Korean Intellectual Property Office, the disclosure of which is incorporated herein by reference.

BACKGROUND

1. Field of the Invention

Aspects of the present invention relate to a secondary battery.

2. Description of the Related Art

With the rapid development of electronics, communication and computer industries, portable electronic devices are now in widespread use. Rechargeable secondary batteries are mainly used as power sources of portable electronic devices.

Batteries having a pack configuration are now widely used as secondary batteries. A secondary battery having a pack configuration includes a bare call for providing electric energy and a protective circuit module (PCM) for stably controlling charge/discharge operations, which are coupled to each other. An external electrode terminal connecting an external device to the secondary battery is disposed on the PCM.

SUMMARY

Aspects of the present invention are therefore directed to a secondary battery including a printed circuit board (PCB) terminal disposed on a protective circuit module (PCM) and stably connecting the secondary battery to an external device.

According to an aspect of the present invention, a secondary battery is provided. The secondary battery includes: a bare cell; a protective circuit module (PCM) disposed on a top surface of the bare cell, the PCM including an external terminal a top surface thereof; and a printed circuit board (PCB) terminal disposed on the external terminal, the PCB terminal electrically connected to the external terminal and an external device.

According to another aspect of the present invention, the PCB terminal may include: a PCB body having a predetermined thickness; a contact pad disposed on a bottom surface of the PCB body, the contact pad connected to the external terminal; and an external pad disposed on a top surface of the PCB body, the external pad electrically connected to the contact pad through at least one via hole passing through the PCB body.

According to another aspect of the present invention, the external pad and the contact pad may be symmetrically disposed with the PCB body therebetween.

According to another aspect of the present invention, the PCB terminal may include three external pads and three contact pads, each of the three external pads corresponding to one of the three contact pads.

According to another aspect of the present invention, the secondary battery may further include a projection jaw on both edges of a bottom surface of the PCB body, the projection jaw preventing the PCB terminal from moving in a direction parallel to that of a top surface of the PCM.

According to another aspect of the present invention, the external pad may be disposed at the highest position in an upward direction of a top surface of the PCM.

According to another aspect of the present invention, the PCM may include a dam on a top surface thereof, the dam preventing the PCM terminal from moving in a direction parallel to that of a top surface of the PCM.

According to another aspect of the present invention, the bare cell may include: a can in which an opening receiving an electrode assembly is defined in a side of the can, the electrode assembly including a first electrode, a second electrode, and a separator disposed between the first electrode and the second electrode and insulating the first electrode from the second electrode; and a cap plate to close the opening of the can and including an electrode terminal connected to the first electrode at a predetermined position, the cap plate being insulated from the electrode terminal.

According to another aspect of the present invention, the PCM may include a flexible printed circuit board (FPCB) on which a control device is mounted.

According to another aspect of the present invention, an electrode terminal through hole passing through the electrode terminal may be defined in a predetermined position of the FPCB of the PCM.

According to another aspect of the present invention, an insulator may be disposed between the FPCB of the PCM and the bare cell.

According to another aspect of the present invention, the secondary battery may include: a top cover covering the PCM and PCB terminal disposed on the top surface of the bare cell; a bottom cover covering a bottom surface of the bare cell; and a label covering lateral surfaces of the bare cell, wherein the top cover has at least one terminal opening to expose the external pad to the outside.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1:
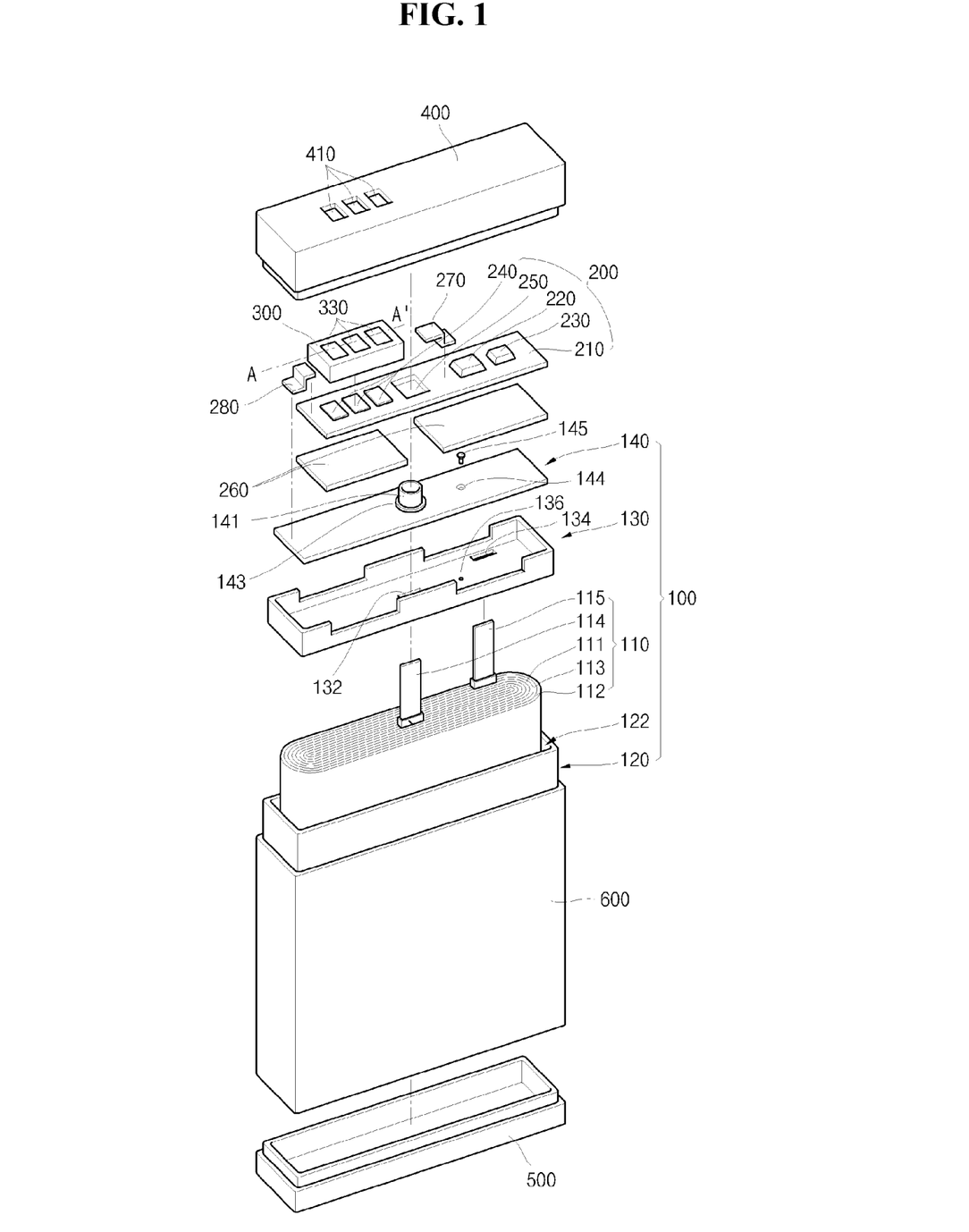
FIGS. 1 and 2 illustrate views of a secondary battery according to an embodiment of the present invention.
Figure 2:
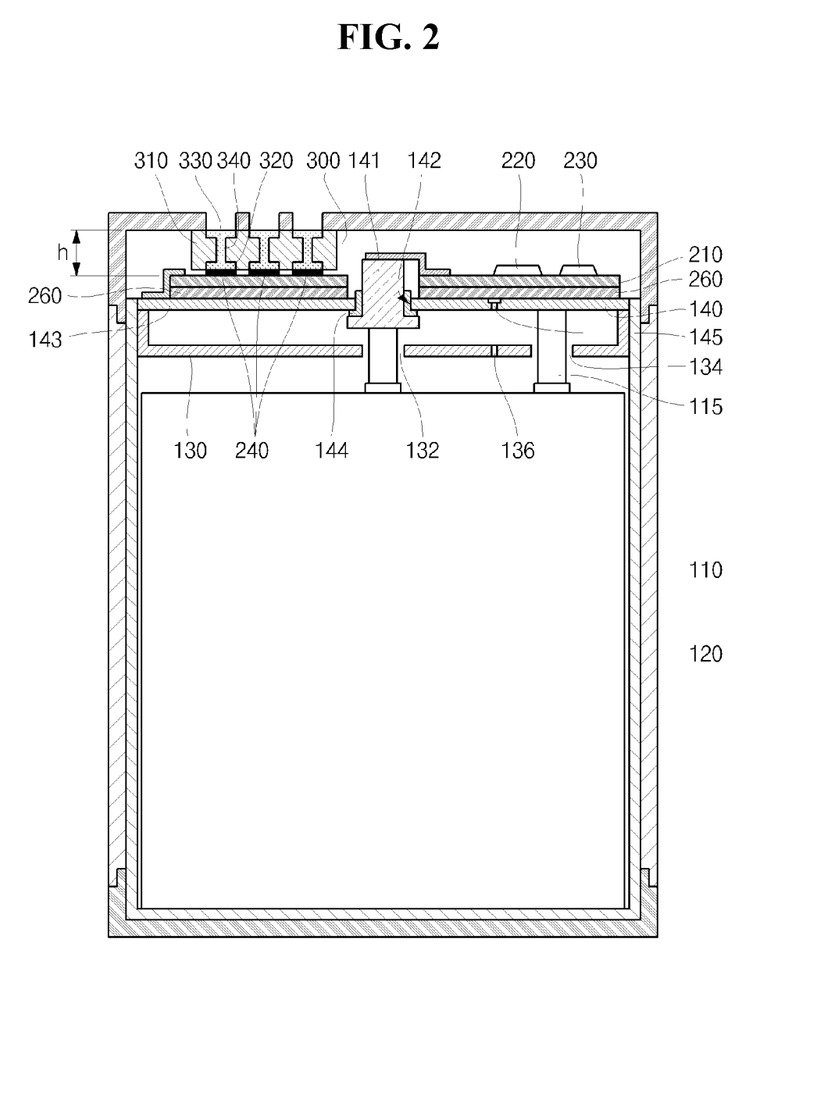
Figure 3A:
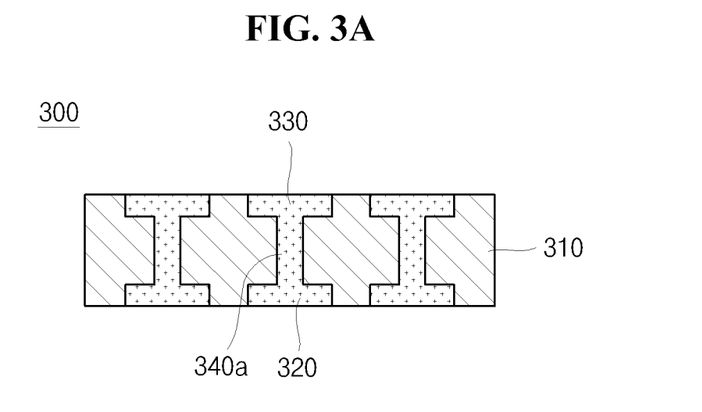
FIGS. 3A to 3D illustrate sectional views taken along line A-A' of FIG. 1.

FIGS. 1 and 2 illustrate views of a secondary battery 1000 according to an embodiment of the present invention. FIGS. 3A to 3D illustrate sectional views taken along line A-A' of FIG. 1, and FIGS. 4A and 4B illustrate views of a portion of a secondary battery according to an embodiment.

FIG. 1 illustrates an exploded perspective view of the secondary battery 1000, and FIG. 2 illustrates a vertical sectional view of FIG. 1. Referring to FIGS. 1 to 4B, the secondary battery 1000 includes a bare cell 100, a protective circuit module (PCM) 200, and a printed circuit board (PCB) terminal 300. The secondary battery 100 further includes a top cover 400, a bottom cover 500, and a label 600. The bare cell 100 includes an electrode assembly 110, a can 120, an insulating case 130, and a cap plate 140.

The electrode assembly 110 includes a first electrode 111, a second electrode 112, and a separator 113 disposed between the first electrode 111 and the second electrode 112 and insulating the first electrode 111 from the second electrode 112. The electrode assembly 110 further includes a wound electrode assembly in which the first electrode 111, the separator 113, and the second electrode 112 are wound in a jelly-roll type.

The first electrode 111 has a positive pole, and the second electrode 112 has a negative pole. Alternatively, the first electrode 111 may have a negative pole, and the second electrode 112 may have a positive pole.

The electrode assembly 110 includes a first electrode tab 115 extending from the first electrode 111 and a second electrode tab 116 extending from the second electrode 112. An opening 122 is defined in a side of the can 120, and the electrode assembly 110 is received through the opening 122. The insulating case 130 is inserted into the opening 122 of the can 120 receiving the electrode assembly 110.

The insulating case 130 serves to prevent the electrode assembly 110 from being shaken inside the can 120 and to insulate a cap plate 140 from the electrode assembly 110. The insulating case 130 includes a first through hole 132 and a second through hole 134 through which the first electrode tab 115 and the second electrode tab 116 of the electrode assembly 110 pass, respectively. The insulating case 130 has an injection hole 136 for injecting an electrolyte into the can 120 receiving the electrode assembly 110.

The cap plate 140 covers the opening 122 of the can 120 receiving the electrode assembly 110 to seal the can 120. The cap plate 140 includes an electrode terminal 141 at a predetermined position on the cap plate 140.

The electrode terminal 141 is inserted into a terminal hole 142 defined in a certain position of the cap plate 140. The electrode terminal 141 is insulated from the cap plate 140 via a gasket 143 disposed between the electrode terminal 141 and the cap plate 140. In addition to insulating the electrode terminal 141 from the cap plate 140, the gasket 142 also prevents the electrolyte injected into the can 120 from leaking to the outside of the can 120.

The electrode terminal 141 is connected to the first electrode tab 114 passing through the first through hole 132 and extending from the first through hole 132. The cap plate 140 is connected to the second electrode tab 115 passing through the second through hole 134 and extending from the second through hole 134.

The cap plate 140 has an electrolyte injection hole 144 to inject the electrolyte. The electrolyte is injected into the can 120 receiving the electrode assembly 110 through the electrolyte injection hole 144. When the electrolyte is injected through the electrolyte injection hole 144, the electrolyte injection hole 144 is sealed via an injection plug 145 to completely close the inside of the can 120.

The PCM 200 is disposed on a top surface of the bare cell 100, i.e., on the cap plate 140. The PCM 200 may include a flexible printed circuit board (FPCB) 210, a control device 220, a protection device 230, and an external device 240. In addition, various devices, such as the control device 220, the protection device 230 and the external device 240, may be mounted on the FPCB 210. The protection device 230 is a device to prevent overcurrent from flowing into the secondary battery 1000.

The FPCB 210 of the PCM 200 has a terminal through hole 250 in a certain position thereof. The electrode terminal 141 of the bare cell 100 passes through the terminal through hole 250.

The PCM 200 is attached on the cap plate 140, and the electrode terminal 141 of the bare cell 100 passes through the terminal through hole 250 to protrude from the terminal through hole 250.

An insulator 260 may be disposed between a bottom surface of the PCM 200 and a top surface of the cap plate 140. The insulator 260 insulates the PCM 200 from the cap plate 140. A member having an adhesive strength, such as a double-sided adhesive tape, may be used as the insulator 260. Thus, the insulator 260 may both insulate the PCM 200 from the cap plate 140, and fix the PCM 200 on the top surface of the cap plate 140.

The PCM 200 is electrically connected to the electrode terminal 141 and the cap plate 140. The PCM 200 is electrically connected to the electrode terminal 141 via a first connection member 270. The PCM 200 is electrically connected to the cap plate 140 via a second connection member 280.

The first connection member 270 may be connected to the electrode terminal 141 via laser welding and connected to the PCM 200 via soldering. Similarly, the second connection member 280 may be connected to the cap plate 140 via laser welding and connected to the PCM 200 via soldering.

The PCB terminal 300 is disposed on the top surface of the FPCB 210 to correspond to the external terminal 240 disposed on the top surface the FPCB 210. The PCB terminal 300 will now be described in detail with reference to FIGS. 3A to 3D. The PCB terminal 300 includes a PCB body 310 having a predetermined thickness, a contact pad 320 disposed on a bottom surface of the PCB body 310, an external pad 330 disposed on a top surface of the PCB body 320, and via holes 340a, 340b, 340c, and 340d connecting the contact pad 320 to the external pad 330. The PCB terminal 300 may be attached to the PCM 200 by contact between the contact pad 320 and the external terminal 240, i.e., contact due to a welding process, such as soldering.

Figure 3B:
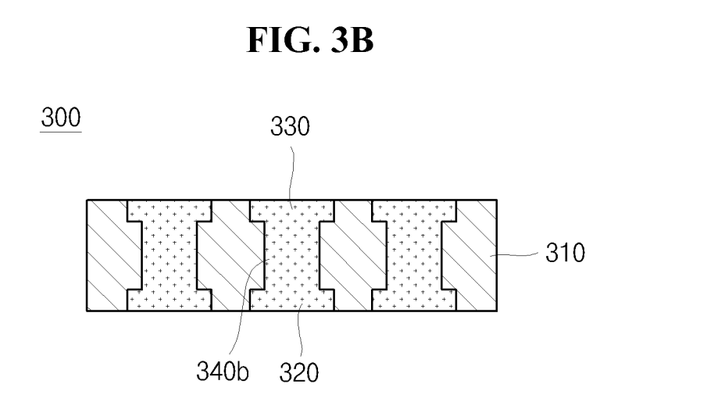
Figure 3C:
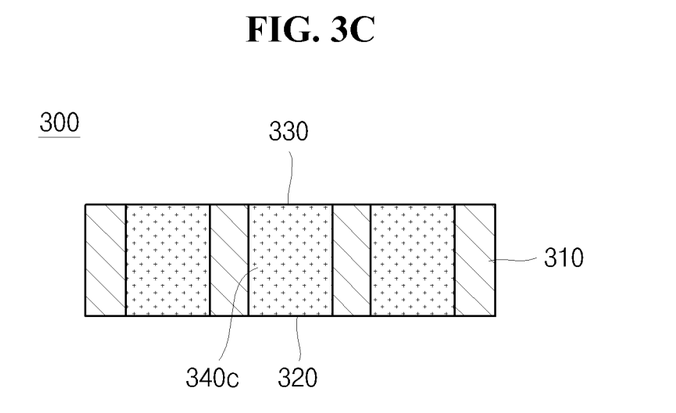
Figure 3D:
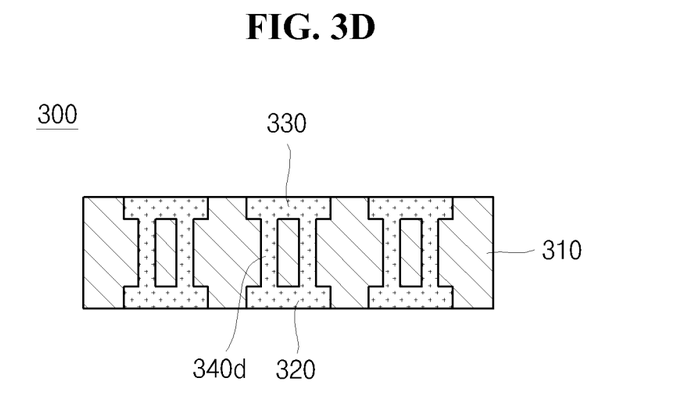
Figure 4A:
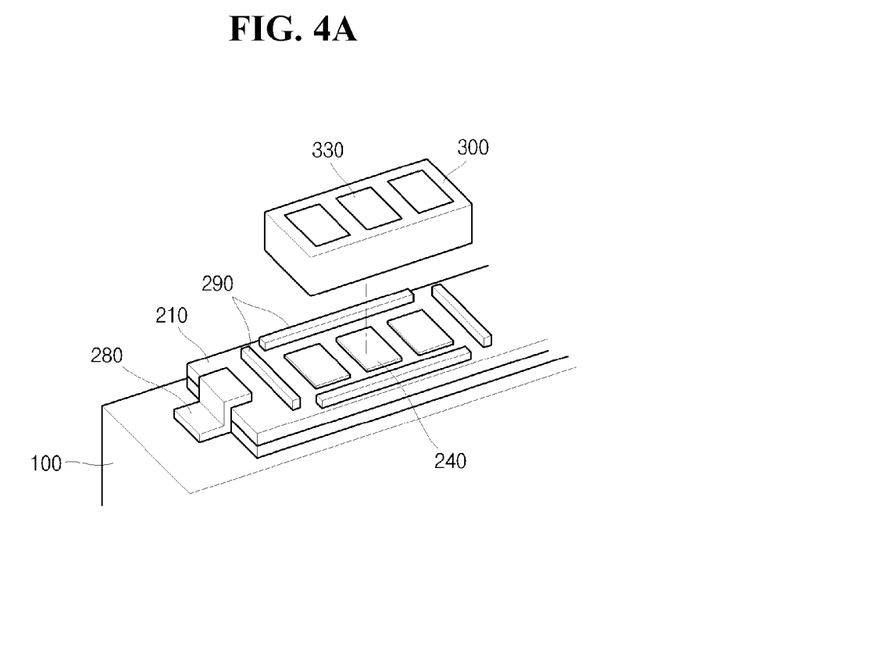
FIGS. 4A and 4B illustrate views of a portion of a secondary battery according to an embodiment of the present invention.
Figure 4B:
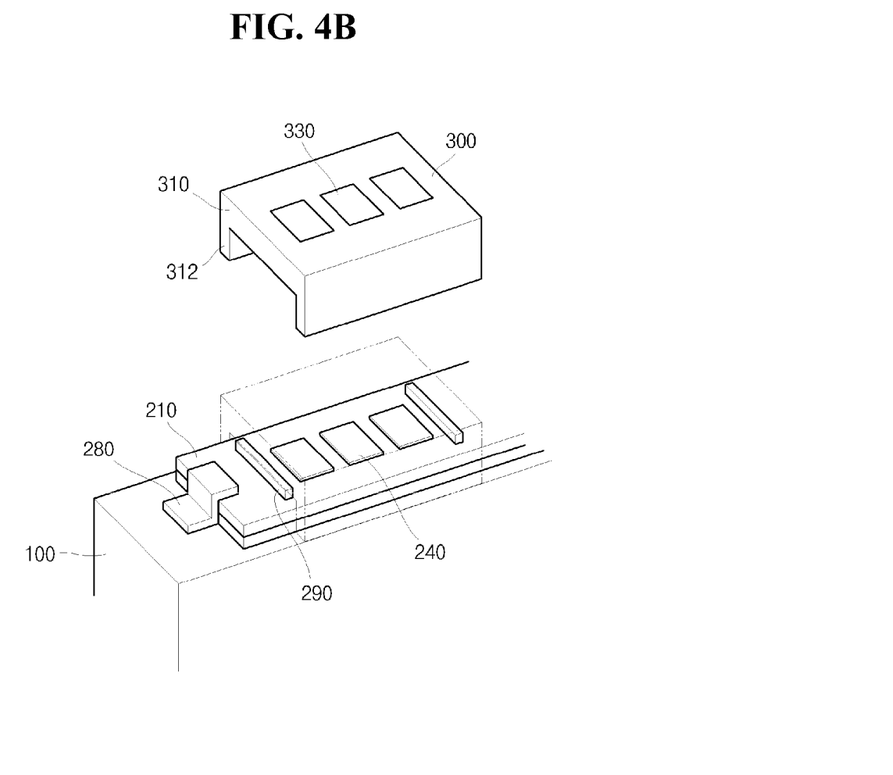

The PCB terminals 300 illustrated in FIGS. 3B to 3D have the same configuration and operation, except the number of via holes 340a, 340b, 340c, and 340d and configurations of the via holes 340a, 340b, 340c, and 340d.

The PCB terminal 300 illustrated in FIG. 3A has a width or diameter less than those of the contact pad 320 and the external pad 330. As shown in FIG. 3A, only one via hole 340a connecting the contact pad 320 to the external pad 330 is provided.

The PCB terminal 300 illustrated in FIG. 3B has a width or diameter similar to those of the contact pad 320 and the external pad 330. As shown in FIG. 3B, only one via hole 340b connecting the contact pad 320 to the external pad 330 is provided.

In the PCB terminal 300 illustrated in FIG. 3C, the contact pad 320, the external pad 330, and the via hole 340c are integrally formed with each other. The via hole 340c has the same configuration as the contact pad 320 corresponding to the electrode terminal 240 and passes through the PCB body 310 to form the external pad 330.

The PCB terminal 300 illustrated in FIG. 3D connects the contact pad 320 to the external pad 330. Two via holes 340d connect a pair of contact pads 320 to a pair of external pads 330, respectively. Although two via holes 240d connect the contact pad 320 to the external pad 330, which correspond to each other in FIG. 3D, the this embodiment is not limited thereto. For example, three or more via holes 240d may connect the contact pad 320 to the external pad 330, which correspond to each other.

The PCB terminal 300, and more particularly, the external pad 330, should have a height h greater than those of other devices provided in the PCM 200, such as the control device 230, the first connection member 270, and the second connection member 280. The external pad 330 should be disposed at the highest position on the top surface of the PCM 200. This is done because the external pad 330 is connected to an external device through a terminal opening 410. The height h represents a vertical distance from the top surface of the PCM 200 to a surface of the external pad 330.

Since the PCB terminal 300 is attached to the PCM 200 by the contact between the contact pad 320 and the external terminal 240, i.e., the contact due to a welding process such as soldering, it may be necessary to prevent the PCB terminal 300 from being vertically or horizontally moved on the surface of the FPCB 210.

To prevent the movement of the PCB terminal 300, as illustrated in FIG. 4A, dams 290 may be disposed on certain positions of the surface of the FPCB 210. The dams 290 are disposed on the certain positions of the surface of the FPCB 210 to support four lateral surfaces of the PCB terminal 300.

The PCB body 310 of the PCB terminal 300 may also be modified in configuration to prevent the movement of the PCB terminal 300. As illustrated in FIG. 4B, a projection jaw 312 may be disposed on two edges of a bottom surface of the PCB body 310 of the PCB terminal 300 to prevent the movement of the PCB terminal 300.

The projection jaw 312 surrounds certain regions of both lateral surfaces of the FPCB 210. As illustrated in FIG. 4B, when the PCB terminal 300 is mounted on the FPCB 210, the projection jaw 312 may surround both lateral surfaces of the FPCB 210 to prevent the movement of the PCB terminal 300. The dams 290 may be further disposed on the FPCB 210 such that the dams 290 contact lower lateral surfaces of the PCB terminal 300 in which the projection jaw 312 is not provided. The dams 290 and the projection jaw 312 may guide the PCB terminal 300 such that the external terminal 240 disposed on the surface of the FBCB 210 accurately contacts the contact pad 320 of the PCB terminal 300.

The top cover 400, the bottom cover 500, and the label 600 completely surround the bare cell 100 and the PCM 200 to which the PCB terminal 300 is attached. As illustrated in FIG. 1, the top cover 400 covers the members disposed on the top surface of the bare cell 100, i.e., the PCM 200 and the PCB terminal 300. The bottom cover 500 covers a bottom surface of the bare cell 100, and the label 600 covers lateral surfaces of the bare cell 100.

The terminal opening 410 is defined in a predetermined position, i.e., a position corresponding to the external pad 330 of the PCB terminal 300. As illustrated in FIG. 2, the terminal opening 410 is disposed such that an inner surface of the top cover 400 contacts the top surface of the PCB terminal 310 to expose the external pad 330. If the external pad 330 protrudes from the top surface of the PCB body 310, the external pad 330 may pass through the inside of the terminal opening 410 or the opening 410 and be exposed to the outside by the protruding height.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A secondary battery comprising:
   a bare cell;
   a protective circuit module (PCM) disposed on a top surface of the bare cell, the PCM including a flexible printed circuit board (FPCB), and a control device, a protection device and an external terminal mounted on a top surface of the FPCB; and
   a printed circuit board (PCB) terminal disposed on the external terminal, the PCB terminal electrically connected to the external terminal and an external device,
   wherein the PCB terminal comprises:
   a PCB body having a predetermined thickness and a top surface and a bottom surface;
   a contact pad exposed outside the bottom surface of the PCB body, the contact pad connected to the external terminal; and
   an external pad exposed outside the top surface of the PCB body, the external pad electrically connected to the contact pad through at least one via hole passing through the PCB body,
   wherein the external pad and the contact pad are symmetrically disposed with the PCB body therebetween.

2. The secondary battery according to claim 1, wherein the PCB terminal comprises three external pads and three contact pads, each of the three external pads corresponding to one of the three contact pads.

3. The secondary battery according to claim 1, further comprising a protection jaw on both edges of the bottom surface of the PCB body, the protection jaw preventing the PCB terminal from moving in a direction parallel to that of a top surface of the PCM.

4. The secondary battery according to claim 1, wherein the external pad is disposed at the highest position in an upward direction of a top surface of the PCM.

5. The secondary battery according to claim 1, wherein the PCM comprises a dam on a top surface thereof, the dam preventing the PCM terminal from moving in a direction parallel to that of a top surface of the PCM.

6. The secondary battery according to claim 1, wherein the bare cell comprises:
   a can in which an opening receiving an electrode assembly is defined in a side of the can, the electrode assembly including a first electrode, a second electrode, and a separator disposed between the first electrode and the second electrode and insulating the first electrode from the second electrode; and
   a cap plate to close the opening of the can and including an electrode terminal connected to the first electrode at a predetermined position;
   wherein the cap plate is insulated from the electrode terminal.

7. The secondary battery according to claim 1, wherein an electrode terminal through hole passing through the electrode terminal is defined in a predetermined position of the FPCB of the PCM.

8. The secondary battery according to claim 1, wherein an insulator is disposed between the FPCB of the PCM and the bare cell.

9. The secondary battery according to claim 1, wherein the secondary battery comprises:
   a top cover covering the PCM and a PCB terminal disposed on the top surface of the bare cell;
   a bottom cover covering a bottom surface of the bare cell; and a label covering lateral surfaces of the bare cell,
   wherein the top cover has at least one terminal opening to expose the external pad to the outside.

10. The secondary battery according to claim 1, wherein the PCB terminal comprises one via hole connecting the contact pad to the external pad.

11. The secondary battery according to claim 1, wherein the contact pad, the external pad, and the at least one via hole are integrally formed.

12. The secondary battery according to claim 1, wherein:
    the contact pad comprises at least two contact pads;
    the external pad comprises at least two external pads; and
    each of the at least two contact pads is connected to a corresponding one of the at least two external pads by at least two via holes.

13. The secondary battery according to claim 1, wherein a width or diameter of the via hole is substantially similar to a width or diameter of the contact pad and the external pad.

14. The secondary battery according to claim 1, wherein a width or diameter of the via hole is less than a width or diameter of the contact pad and the external pad.

* * * * *